(12) United States Patent
Parker et al.

(10) Patent No.: US 11,275,471 B2
(45) Date of Patent: Mar. 15, 2022

(54) AUDIO DEVICE WITH FLEXIBLE CIRCUIT FOR CAPACITIVE INTERFACE

(71) Applicant: Bose Corporation, Framingham, MA (US)

(72) Inventors: Robert Preston Parker, Westborough, MA (US); Thomas Aquinas Nilsen, Auburn, MA (US)

(73) Assignee: BOSE CORPORATION, Framingham, MA (US)

( * ) Notice: Subject to any disclaimer, the term of this patent is extended or adjusted under 35 U.S.C. 154(b) by 126 days.

(21) Appl. No.: 16/919,634

(22) Filed: Jul. 2, 2020

(65) Prior Publication Data

US 2022/0004272 A1 Jan. 6, 2022

(51) Int. Cl.
| | |
|---|---|
| *H04R 1/10* | (2006.01) |
| *G06F 3/044* | (2006.01) |
| *H05K 1/18* | (2006.01) |
| *H04R 3/00* | (2006.01) |

(52) U.S. Cl.
CPC ........... *G06F 3/044* (2013.01); *H04R 1/1041* (2013.01); *H05K 1/189* (2013.01); *H04R 1/105* (2013.01); *H04R 3/00* (2013.01); *H04R 2203/00* (2013.01); *H05K 2201/056* (2013.01); *H05K 2201/10151* (2013.01)

(58) Field of Classification Search
CPC ........ G06F 3/044; H04R 1/1041; H05K 1/189
See application file for complete search history.

(56) References Cited

U.S. PATENT DOCUMENTS

| | | | |
|---|---|---|---|
| 6,452,494 | B1 | 9/2002 | Harrison |
| 7,010,332 | B1 | 3/2006 | Irvin et al. |
| 7,805,171 | B2 | 9/2010 | Alameh et al. |
| 7,925,029 | B2 | 4/2011 | Hollemans et al. |
| 7,945,297 | B2 | 5/2011 | Philipp |
| 8,045,727 | B2 | 10/2011 | Philipp |
| 8,315,406 | B2 | 11/2012 | Kon |
| 8,315,876 | B2 | 11/2012 | Reuss |
| 8,335,312 | B2 | 12/2012 | Gerhardt et al. |

(Continued)

FOREIGN PATENT DOCUMENTS

| | | |
|---|---|---|
| CN | 202721822 U | 2/2013 |
| CN | 102761816 B | 9/2014 |

(Continued)

OTHER PUBLICATIONS

PCT International Search Report and Written Opinion for International Application No. PCT/US2021/040096, dated Oct. 7, 2021, 14 pages.

(Continued)

*Primary Examiner* — Simon King
(74) *Attorney, Agent, or Firm* — Hoffman Warnick LLC (57) ABSTRACT

Various aspects include audio devices with a capacitive sensing interface along a compound curved wall. Some aspects of the disclosure relate to wearable audio devices with a capacitive sensing interface and a flexible printed circuit board (PCB) for detecting a touch command at the interface. In certain cases, the flexible PCB has at least one slit for conforming to the compound curve of the wall. In additional implementations, the inner surface of the wall is faceted and the flexible PCB conforms to the facets in the wall.

20 Claims, 9 Drawing Sheets

(56) References Cited

U.S. PATENT DOCUMENTS

| | | |
|---|---|---|
| 8,428,053 B2 | 4/2013 | Kannappan |
| 8,538,009 B2 | 9/2013 | Gerhardt et al. |
| 8,559,621 B2 | 10/2013 | Gerhardt et al. |
| RE44,980 E | 7/2014 | Sargaison |
| 8,798,042 B2 | 8/2014 | Kannappan |
| 8,805,452 B2 | 8/2014 | Lee |
| 8,831,242 B2 | 9/2014 | Brown et al. |
| 8,907,867 B2 | 12/2014 | Wong et al. |
| 8,954,177 B2 | 2/2015 | Sanders |
| 9,094,764 B2 | 7/2015 | Rosener |
| 9,117,443 B2 | 8/2015 | Walsh |
| 9,124,970 B2 | 9/2015 | Rabii et al. |
| 9,280,239 B2 | 3/2016 | Rosener |
| 9,286,742 B2 | 3/2016 | Rosener et al. |
| 9,338,540 B2 | 5/2016 | Nicholson |
| 9,479,857 B2 | 10/2016 | Rosener et al. |
| 9,486,823 B2 | 11/2016 | Andersen et al. |
| 9,998,817 B1 | 6/2018 | Liu |
| 10,484,793 B1 * | 11/2019 | Peterson ............... G06F 3/0446 |
| 2005/0277446 A1 | 12/2005 | Yueh |
| 2006/0013079 A1 | 1/2006 | Rekimoto |
| 2006/0045304 A1 | 3/2006 | Lee et al. |
| 2006/0233413 A1 | 10/2006 | Nam |
| 2007/0274530 A1 | 11/2007 | Buil et al. |
| 2007/0281762 A1 | 12/2007 | Barros et al. |
| 2007/0297618 A1 | 12/2007 | Nurmi et al. |
| 2008/0130910 A1 | 6/2008 | Jobling et al. |
| 2008/0130936 A1 | 6/2008 | Lau et al. |
| 2008/0143681 A1 | 6/2008 | XiaoPing |
| 2008/0260176 A1 | 10/2008 | Hollemans et al. |
| 2009/0009491 A1 | 1/2009 | Grivna |
| 2009/0124286 A1 | 5/2009 | Hellfalk et al. |
| 2009/0131124 A1 | 5/2009 | Bibaud et al. |
| 2009/0154720 A1 | 6/2009 | Oki |
| 2010/0292945 A1 | 11/2010 | Reynolds et al. |
| 2011/0007908 A1 | 1/2011 | Rosener et al. |
| 2011/0077056 A1 | 3/2011 | Park et al. |
| 2011/0182458 A1 | 7/2011 | Rosener et al. |
| 2012/0086551 A1 | 4/2012 | Lowe et al. |
| 2012/0244812 A1 | 9/2012 | Rosener |
| 2012/0306805 A1 | 12/2012 | Chan |
| 2013/0082951 A1 | 4/2013 | Tanaka et al. |
| 2013/0114823 A1 | 5/2013 | Kari et al. |
| 2013/0121494 A1 | 5/2013 | Johnston |
| 2013/0279724 A1 | 10/2013 | Stafford et al. |
| 2015/0177298 A1 | 6/2015 | Sugiura |
| 2015/0358088 A1 | 12/2015 | Eim et al. |
| 2016/0210111 A1 | 7/2016 | Kraft |
| 2016/0261023 A1 * | 9/2016 | Di Nallo .................. H01Q 9/42 |
| 2017/0003799 A1 | 1/2017 | Tateda |
| 2017/0301314 A1 | 10/2017 | Kim et al. |
| 2017/0303646 A1 | 10/2017 | Bricken et al. |
| 2019/0129684 A1 | 5/2019 | Willis et al. |
| 2019/0294274 A1 | 9/2019 | Cho et al. |
| 2019/0297408 A1 | 9/2019 | Mohammadi et al. |
| 2020/0037058 A1 * | 1/2020 | Ueda .................... G06F 3/03547 |
| 2020/0186179 A1 * | 6/2020 | Horiuchi ............... H01Q 21/06 |

FOREIGN PATENT DOCUMENTS

| | | |
|---|---|---|
| CN | 103002373 B | 5/2015 |
| CN | 205071294 U | 3/2016 |
| CN | 205081948 U | 3/2016 |
| EP | 2009949 A1 | 12/2008 |
| GB | 2469796 A | 11/2010 |
| WO | 2010014561 A2 | 2/2010 |
| WO | 2012162979 A1 | 12/2012 |

OTHER PUBLICATIONS

PCT International Search Report and Written Opinion for International Application No. PCT/US2019/043605, dated Oct. 23, 2019, 14 pages.

* cited by examiner

AUDIO DEVICE WITH FLEXIBLE CIRCUIT FOR CAPACITIVE INTERFACE

TECHNICAL FIELD

This disclosure generally relates to audio devices. More particularly, the disclosure relates to a capacitive sensing interface with a compound curved shaped in audio devices.

BACKGROUND

Audio devices, for example wearable audio devices such as earbuds, can include compound curved surfaces. In particular form factors, it is beneficial to integrate capacitive sensing interfaces along these compound curved surfaces. However, conventional capacitive sensing interfaces employ circuitry including a planar, flexible printed circuit board (PCB). Fastening the planar, flexible PCB to a compound curved surface can create stresses in the flexible PCB, impacting performance and potentially causing the interface to fail.

SUMMARY

All examples and features mentioned below can be combined in any technically possible way.

Various implementations of the disclosure include audio devices with a capacitive sensing interface. Various particular implementations of the disclosure include an audio device with a capacitive sensing interface integrated into a wall with a compound curved shape.

In some particular aspects, an audio device includes: a housing having a set of walls, where at least one of the walls has a compound curved shape including an outer surface and an inner surface each with a compound curve; and a capacitive sensing interface integrated with the wall having the compound curved shape, the capacitive sensing interface including: a contact surface for receiving a touch command at the outer surface of the wall; and a flexible printed circuit board (PCB) underlying the contact surface for detecting the touch command at the contact surface, where the flexible PCB extends along the inner surface of the wall and includes at least one slit that enable the flexible PCB to conform with the compound curve of the inner surface.

In other particular aspects, an audio device includes: a housing having a set of walls, where at least one of the walls has a compound curved shape including an outer surface and an inner surface, where the inner surface includes distinct facets connected by a set of junctions; and a capacitive sensing interface integrated with the wall having the compound curved shape, the capacitive sensing interface including: a contact surface for receiving a touch command at the outer surface of the wall; and a flexible printed circuit board (PCB) underlying the contact surface for detecting the touch command at the contact surface, where the flexible PCB extends along the inner surface of the wall.

Implementations may include one of the following features, or any combination thereof.

In certain aspects, each slit partially separates sections of the flexible PCB.

In some cases, the at least one slit includes at least two slits that partially separate at least three sections of the flexible PCB.

In particular implementations, the at least one slit enables the flexible PCB to conform with the compound curve of the inner surface without interference between adjacent sections of the flexible PCB.

In certain cases, each slit has a length-to-width ratio of at least 1:1.

In some implementations, the audio device further includes: an acoustic transducer having a sound-radiating surface for providing an audio output; and a controller coupled with the acoustic transducer and the flexible PCB, the controller configured to control the audio output from the acoustic transducer based on commands received at the capacitive sensing interface.

In particular aspects, the capacitive sensing interface includes a capacitive touch interface for detecting the touch command from a human user.

In certain implementations, the compound curve of the inner surface includes a convex compound curve or a concave compound curve.

In some cases, the audio device includes a wearable audio device including at least one of: headphones, earphones, audio eyeglasses, body-worn speakers, or audio jewelry.

In particular aspects, the wall has a substantially constant thickness along a longest dimension of the capacitive sensing interface.

In certain implementations, the audio device further includes an adhesive coupling the flexible PCB with the inner surface of the wall.

In some aspects, the set of junctions includes at least two junctions that connect at least three facets of the inner surface.

In certain cases, each facet has a non-uniform thickness across its length such that a portion of each facet is thinner proximate a junction with an adjacent facet than a remaining portion of the facet.

In particular implementations, the set of junctions enable the flexible PCB to conform with the inner surface without interference between adjacent sections of the flexible PCB.

In some cases, the audio device further includes an adhesive coupling the flexible PCB with the inner surface of the wall, where each of the facets has an approximately equal surface area.

In certain aspects, the audio device further includes an acoustic transducer having a sound-radiating surface for providing an audio output; and a controller coupled with the acoustic transducer and the flexible PCB, the controller configured to control the audio output from the acoustic transducer based on commands received at the capacitive sensing interface, where the capacitive sensing interface includes a capacitive touch interface for detecting the touch command from a human user.

In particular implementations, the compound curve of the outer surface includes a concave compound curve.

In some cases, the inner surface further includes at least one curved section adjacent to at least one of the facets.

In certain aspects, the flexible PCB has at least one slit that enable the flexible PCB to conform with the faceted inner surface.

Two or more features described in this disclosure, including those described in this summary section, may be combined to form implementations not specifically described herein.

The details of one or more implementations are set forth in the accompanying drawings and the description below. Other features, objects and advantages will be apparent from the description and drawings, and from the claims.

It is noted that the drawings of the various implementations are not necessarily to scale. The drawings are intended to depict only typical aspects of the disclosure, and therefore should not be considered as limiting the scope of the invention. In the drawings, like numbering represents like elements between the drawings.

DETAILED DESCRIPTION

As noted herein, various aspects of the disclosure generally relate to audio devices with a capacitive sensing interface along a compound curved wall. More particularly, aspects of the disclosure relate to wearable audio devices with a capacitive sensing interface and a flexible printed circuit board (PCB) for detecting a touch command at the interface. In certain cases, the flexible PCB has at least one slit for conforming to the compound curve of the wall. In additional implementations, the inner surface of the wall is faceted and the flexible PCB conforms to the facets in the wall.

Commonly labeled components in the FIGURES are considered to be substantially equivalent components for the purposes of illustration, and redundant discussion of those components is omitted for clarity.

Aspects and implementations disclosed herein may be applicable to a wide variety of speaker systems, such as audio devices and wearable audio devices. Audio devices can include fixed and/or portable speakers, speakers integrated into other systems (e.g., automobile audio systems), and/or networks of speakers. In some cases, wearable audio devices can take various form factors, such as headphones (whether on or off ear), headsets, watches, eyeglasses, audio accessories or clothing (e.g., audio hats, audio visors, audio jewelry), neck-worn speakers, shoulder-worn speakers, body-worn speakers, etc. Some particular aspects disclosed may be particularly applicable to personal (wearable) audio devices such as in-ear headphones (also referred to as earbuds), eyeglasses or other head-mounted audio devices. It should be noted that although specific implementations of speaker systems primarily serving the purpose of acoustically outputting audio are presented with some degree of detail, such presentations of specific implementations are intended to facilitate understanding through provision of examples and should not be taken as limiting either the scope of disclosure or the scope of claim coverage.

The wearable audio devices described according to various implementations can include features found in one or more other wearable electronic devices, such as smart glasses, smart watches, etc. These wearable audio devices can include additional hardware components, such as one or more cameras, location tracking devices, microphones, etc., and may be capable of voice recognition, visual recognition, and other smart device functions. The description of wearable audio devices included herein is not intended to exclude these additional capabilities in such a device.

As noted herein, conventional capacitive sensing interfaces employ circuitry including a planar, flexible printed circuit board (PCB). Fastening the planar, flexible PCB to a compound curved surface (i.e., a surface with curves in both X and Y directions) can create stresses in the flexible PCB, as well as cause the flexible PCB to detach from the device wall. These issues can lead to decreased sensitivity at the interface, and in some cases, interface failure.

In contrast to conventional devices, various implementations include audio devices with a flexible PCB that has at least one slit to enable the PCB to conform with the compound curve of the inner surface of the device wall. In additional implementations, the inner surface of the device wall is faceted to enable the PCB to conform with that surface. In certain cases, the inner surface is faceted and the PCB includes at least one slit to enable that PCB to conform with the faceted surface of the device wall.

Figure 1:
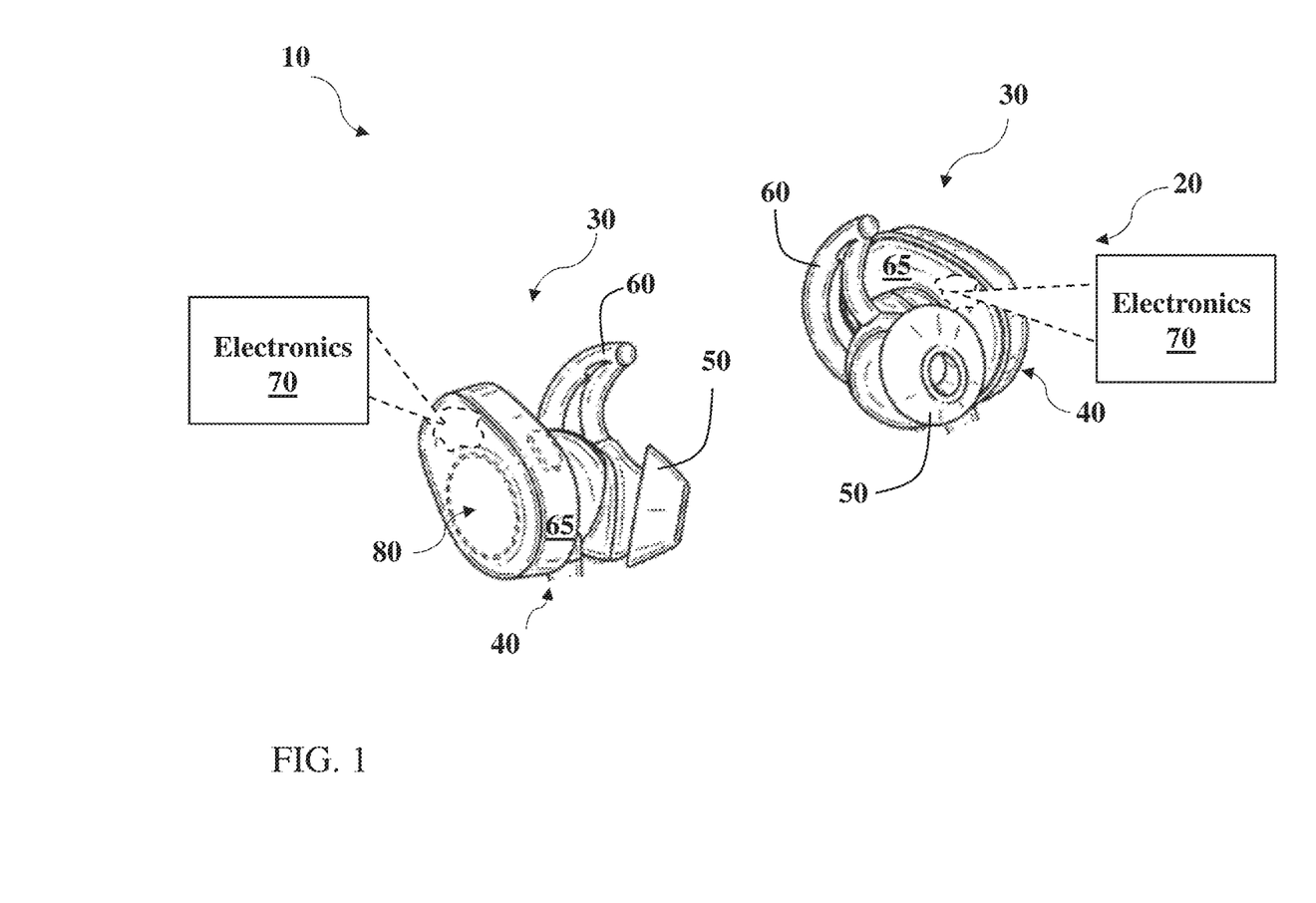
FIG. 1 is a schematic depiction of an audio device according to various implementations.
Figure 2:
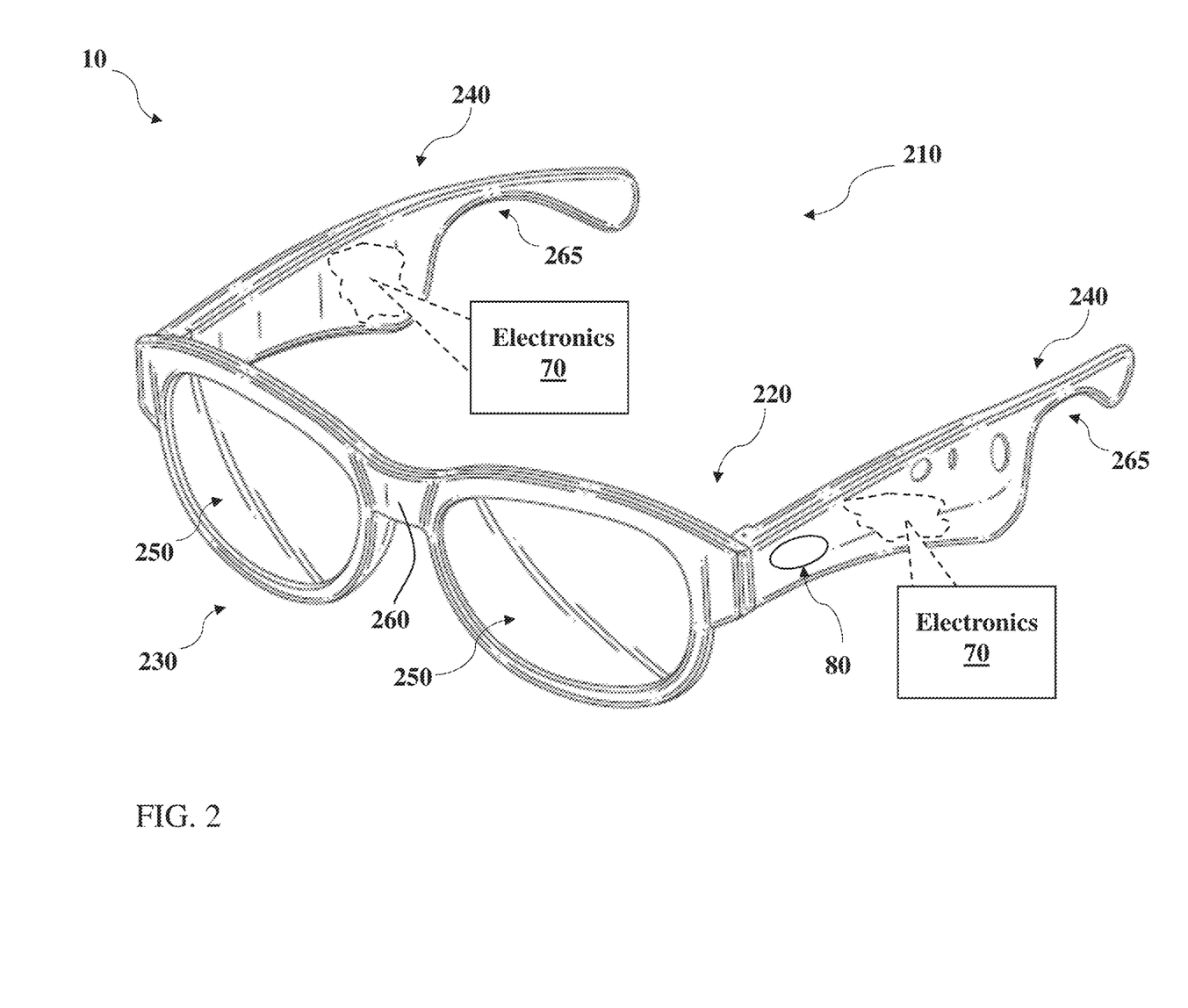
FIG. 2 is a schematic depiction of an additional audio device according to various implementations.
Figure 3:
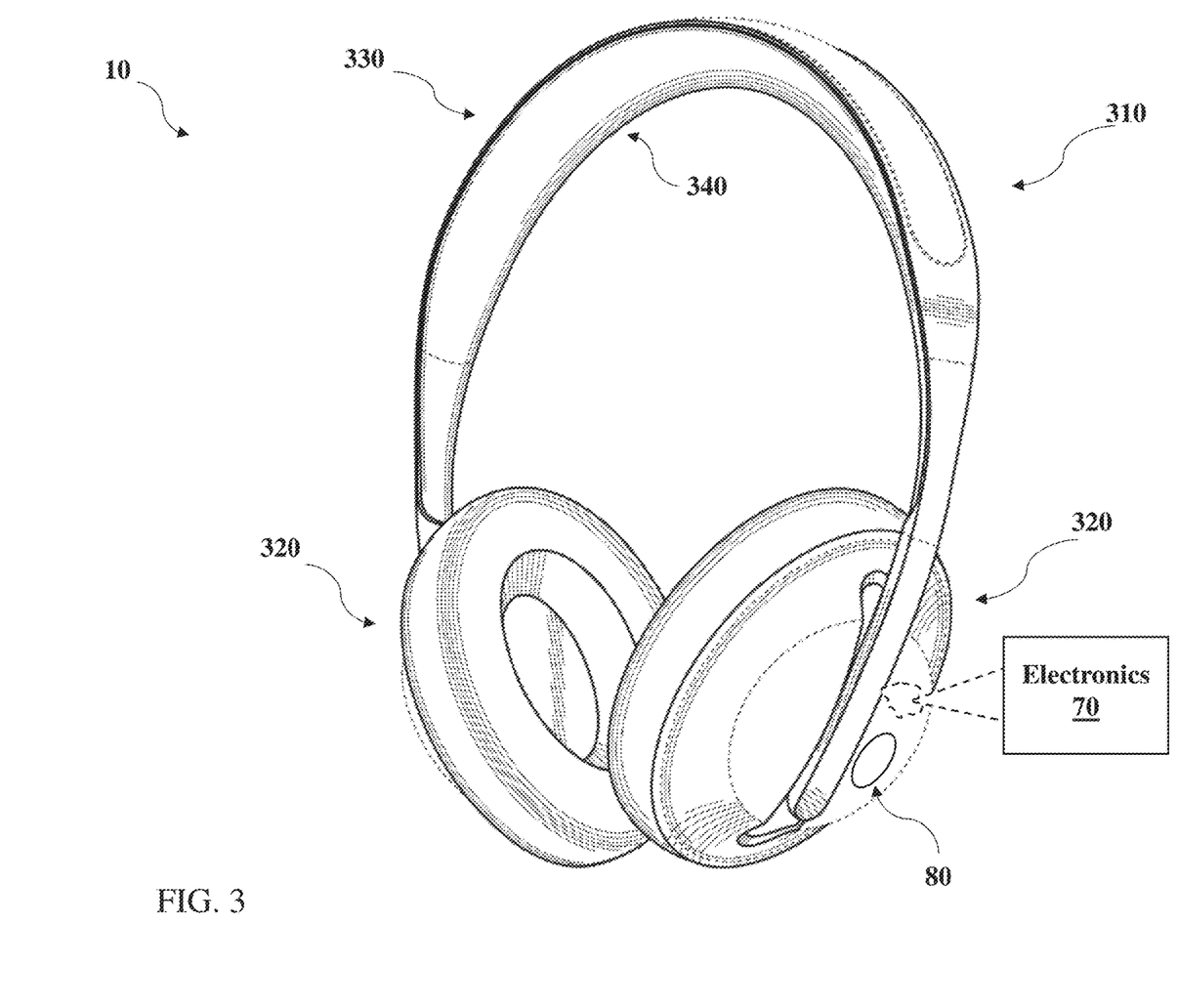
FIG. 3 is a schematic depiction of another audio device according to various implementations.

FIGS. 1-3 illustrate examples of audio devices that may incorporate the teachings of the various implementations. These examples are not intended to be limiting.

FIG. 1 is a schematic depiction of a first example audio device 10. In this example, the audio device 10 is an audio headset 20 having at least one earbud (or, in-ear headphone) 30. Two earbuds 30 are illustrated in this example. While the earbuds 30 are shown in a "true" wireless configuration (i.e., without tethering between earbuds 30), the audio headset 20 could also include a tethered wireless configuration (whereby the earbuds 30 are connected via wire with a wireless connection to a playback device) or a wired configuration (whereby at least one of the earbuds 30 has a wired connection to a playback device). Each earbud 30 is shown including a body 40, which can include a casing formed of one or more plastics or composite materials. The body 40 can include a nozzle 50 for insertion into a user's ear canal entrance, a support member 60 for retaining the nozzle 50 in a resting position within the user's ear, and an outer casing 65 for housing electronics 70, including components of a capacitive sensing interface 80 (e.g., a capacitive touch interface). In some cases, separate, or duplicate sets of electronics 70 are contained in portions of the earbuds 30, e.g., each of the respective earbuds 30. However, certain components described herein can also be present in singular form.

FIG. 2 depicts an additional example audio device 10, including audio eyeglasses 210. As shown, the audio eyeglasses 210 can include a frame 220 having a lens region 230 and a pair of arms 240 extending from the lens region 230. As with conventional eyeglasses, the lens region 230 and arms 240 are designed for resting on the head of a user. The lens region 230 can include a set of lenses 250, which can include prescription, non-prescription and/or light-filtering lenses, as well as a bridge 260 (which may include padding) for resting on the user's nose. Arms 240 can include a contour 265 for resting on the user's respective ears. Contained within the frame 220 (or substantially contained, such that a component can extend beyond the boundary of the frame) are electronics 70 and other components for controlling the audio eyeglasses 210 according to particular implementations. Electronics 70 can include portions of a capacitive sensing interface 80, as described with respect to the audio devices 10 herein. In some cases, separate, or duplicate sets of electronics 70 are contained in portions of the frame, e.g., each of the respective arms 240 in the frame 220. However, certain components described herein can also be present in singular form.

FIG. 3 depicts another audio device 10, including around-ear headphones 310. Headphones 310 can include a pair of earcups 320 configured to fit over the ear, or on the ear, of a user. A headband 330 spans between the pair of earcups 320 and is configured to rest on the head of the user (e.g., spanning over the crown of the head or around the head). The headband 330 can include a head cushion 340 in some implementations. Stored within one or both of the earcups 320 are electronics 70 and other components for controlling the headphones 310 according to particular implementations. Electronics 70 can include portions of a capacitive sensing interface 80, as described with respect to the wearable audio devices 10 herein. It is understood that a number of wearable audio devices described herein can utilize the features of the various implementations, and the wearable audio devices 10 shown and described with reference to FIGS. 1-3 are merely illustrative.

Figure 4:
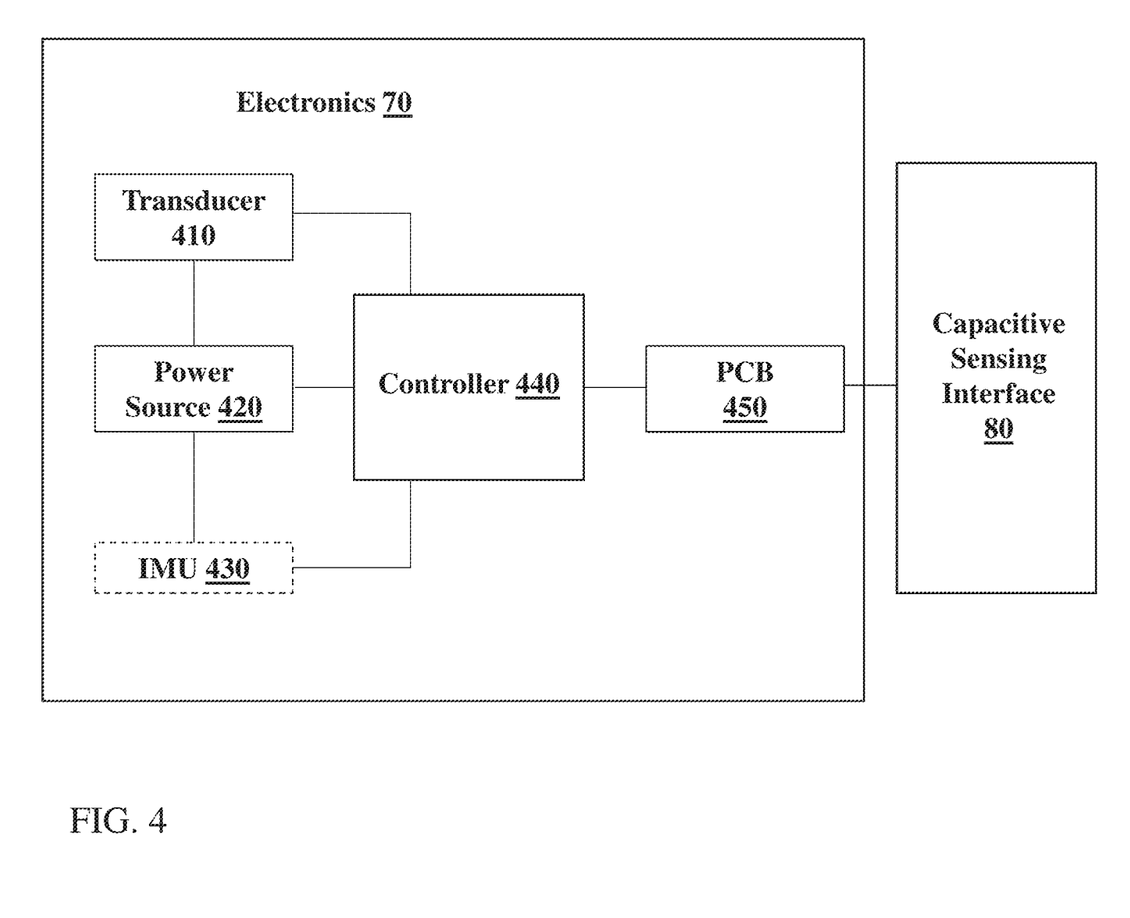
FIG. 4 is a system diagram illustrating electronics and a connected capacitive sensing interface within the audio devices of FIGS. 1-3, according to various implementations.

FIG. 4 shows a schematic depiction of example electronics 70 contained (at least partially) within the audio devices 10 (e.g., as shown in FIGS. 1-3), along with components of the capacitive sensing interface 80. It is understood that one or more of the components in electronics 70 may be implemented as hardware and/or software, and that such components may be connected by any conventional means (e.g., hard-wired and/or wireless connection). It is further understood that any component described as connected or coupled to another component in the audio device 10 or other systems disclosed according to implementations may communicate using any conventional hard-wired connection and/or additional communications protocols. In some cases, communications protocol(s) can include a Wi-Fi protocol using a wireless local area network (LAN), a communication protocol such as IEEE 802.11 b/g a cellular network-based protocol (e.g., third, fourth or fifth generation (3G, 4G, 5G cellular networks) or one of a plurality of internet-of-things (IoT) protocols, such as: Bluetooth, BLE Bluetooth, ZigBee (mesh LAN), Z-wave (sub-GHz mesh network), 6LoWPAN (a lightweight IP protocol), LTE protocols, RFID, ultrasonic audio protocols, etc. In various particular implementations, separately housed components in audio device 10 are configured to communicate using one or more conventional wireless transceivers.

As shown in FIG. 4, electronics 70 contained within the audio headset 20 (FIG. 1) can include a transducer 410 and a power source 420. In certain implementations (depicted in phantom as optional), the electronics 70 can further include an inertial measurement unit (IMU) 430 for detecting movement of the wearable audio device 10 and enabling particular control functions. In various implementations, the power source 420 is connected to the transducer 410, and can additionally be connected to the IMU 430. Each of the transducer 410, power source 420 and IMU 90 are connected with a controller 440, which is configured to perform control functions according to various implementations described herein. Electronics 70 can include other components not specifically depicted in the accompanying FIGURES, such as communications components (e.g., a wireless transceiver (WT)) configured to communicate with one or more other electronic devices connected via one or more wireless networks (e.g., a local WiFi network, Bluetooth connection, or radio frequency (RF) connection), and amplification and signal processing components. It is understood that these components or functional equivalents of these components can be connected with, or form part of, the controller 440.

The transducer 410 can include at least one electroacoustic transducer for producing an acoustic output into, or proximate, the ears of a user. In certain implementations (e.g., in the audio eyeglasses example of FIG. 2), each transducer 410 can include a dipole loudspeaker with an acoustic driver or radiator that emits front-side acoustic radiation from its front side, and emits rear-side acoustic radiation to its rear side. The dipole loudspeaker can be built into the housing, frame or casing of the audio device 10, and may be configured for the particular form factor of the audio device 10.

The IMU 430 can include a microelectromechanical system (MEMS) device that combines a multi-axis accelerometer, gyroscope, and/or magnetometer. It is understood that additional or alternative sensors may perform functions of the IMU 430, e.g., an optical-based tracking system, accelerometer, magnetometer, gyroscope or radar for detecting movement as described herein. The IMU 430 can be configured to detect changes in the physical location/orientation of the audio device 10, and provide updated sensor data to the controller 440 in order to indicate a change in the location/orientation of the audio device 10. However, it is understood that the electronics 70 can also include one or more optical or visual detection systems located at the audio device 10 or another connected device configured to detect the orientation of the audio device 10.

The power source 420 to the transducer 410 can be provided locally (e.g., with a battery proximate each transducer 410), or a single battery can transfer power via wiring (not shown) that passes through the frame or housing of the audio device 10, e.g., depending upon the form factor of the particular wearable audio device 10. The power source 420 can be used to control operation of the transducer 410, according to various implementations.

The controller 440 can include conventional hardware and/or software components for executing program instructions or code according to processes described herein. For example, controller 440 may include one or more processors, memory, communications pathways between components, and/or one or more logic engines for executing program code. Controller 440 can be coupled with other components in the electronics 70 via any conventional wireless and/or hardwired connection which allows controller 440 to send/receive signals to/from those components and control operation thereof.

Controller 440 is shown coupled with a printed circuit board (PCB) 450, which in turn is coupled with the capacitive sensing interface 80 (FIGS. 1-3). In some case, the PCB 450 and/or components of the capacitive sensing interface 80 are enclosed in a common housing with the electronics 70, however, these components can be physically separated by one or more partitions in other implementations. The controller 440 is configured to receive touch-based commands from the capacitive sensing interface 80 in order to control operation of the audio device 10. For example, a user can provide a touch command at the capacitive sensing interface 80 in order to power the audio device 10 on or off, switch between playback sources, switch tracks or segments within a playback source, toggle through a menu of playback options, etc.

Figure 5:
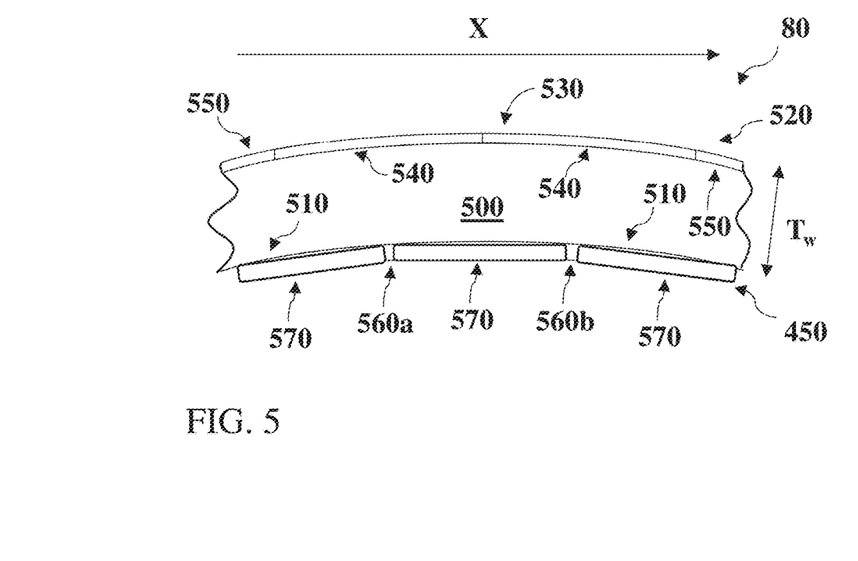
FIG. 5 is a first cross-sectional view of an audio device wall and flexible printed circuit board (PCB) according to various implementations.
Figure 6:
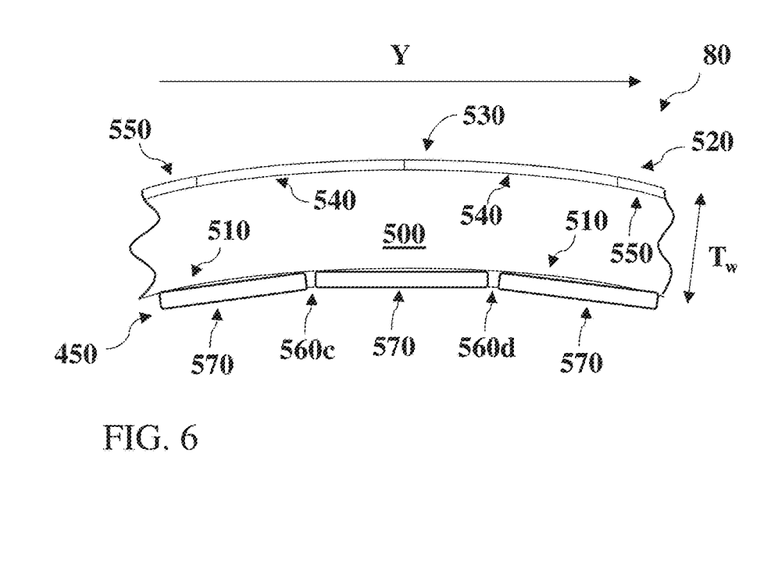
FIG. 6 is a second cross-sectional view of the audio device wall and flexible PCB in FIG. 5.

FIGS. 5 and 6 show two distinct example cross-sectional depictions of a wall 500 through which the capacitive sensing interface 80 extends, e.g., an outer wall in the housing of any of the audio devices 10 shown and described herein. The wall 500 has an inner surface 510 and an outer surface 520. The capacitive sensing interface 80 has a sensing surface 530 (e.g., contact surface) along the outer surface 520 of the wall 500. In certain implementations, the wall 500 includes a compound curved surface, such that the outer surface 520 of the wall 500 curves (or arcs) in both the X and Y directions. In certain cases, as described herein, the inner surface 510 also has a compound curved shape. This example is illustrated in FIGS. 5 and 6, where, for example, the wall 500 has a substantially constant thickness ($T_w$) along the longest dimension of the interface 80. However, in other implementations (shown in FIGS. 8 and 9), the inner surface is faceted, such that the thickness of the wall ($T_{w'}$) varies along its longest dimension. While a concave compound curve is illustrated in FIGS. 5 and 6, it is understood that the inner surface 510 can have a convex compound curved shape in various implementations.

With continuing reference to FIGS. 5 and 6, the capacitive sensing interface 80 is integrated with the wall 500, such that one or more commands (e.g., touch commands) can be received at the sensing surface 530. As is known in the art, when a user (e.g., a user's finger) touches the contact surface of a capacitive touch interface (e.g., sensing surface 530 of capacitive sensing interface 80), it forms a simple parallel plate capacitor, whose digital value is measured and used to detect presence at the particular electrode and/or movement across electrodes (such as in a swiping motion). In various implementations, the capacitive sensing interface 80 includes a plurality of electrodes 540 underlying the capacitive sensing surface 530, e.g., to detect touch and/or swiping commands at the interface 80. Electrodes 540 can include a sensor pad that is connected through the flexible PCB 450 to the controller 440 by one or more via and/or trace connections (not shown). Electrodes 540 can be surrounded or otherwise isolated by a ground hatch 550.

As noted herein, in various implementations, the flexible PCB 450 extends along the inner surface 510 of the wall 500. In these cases, the flexible PCB 450 can be coupled with the inner surface 510 using an adhesive, e.g., a conventional adhesive used in electronics manufacturing. In certain implementations, the configuration of the flexible PCB 450 enables that PCB 450 to be effectively adhered to the inner surface 510 without the need for high-strength (e.g., very high bond, or VHB) adhesives.

Figure 7:
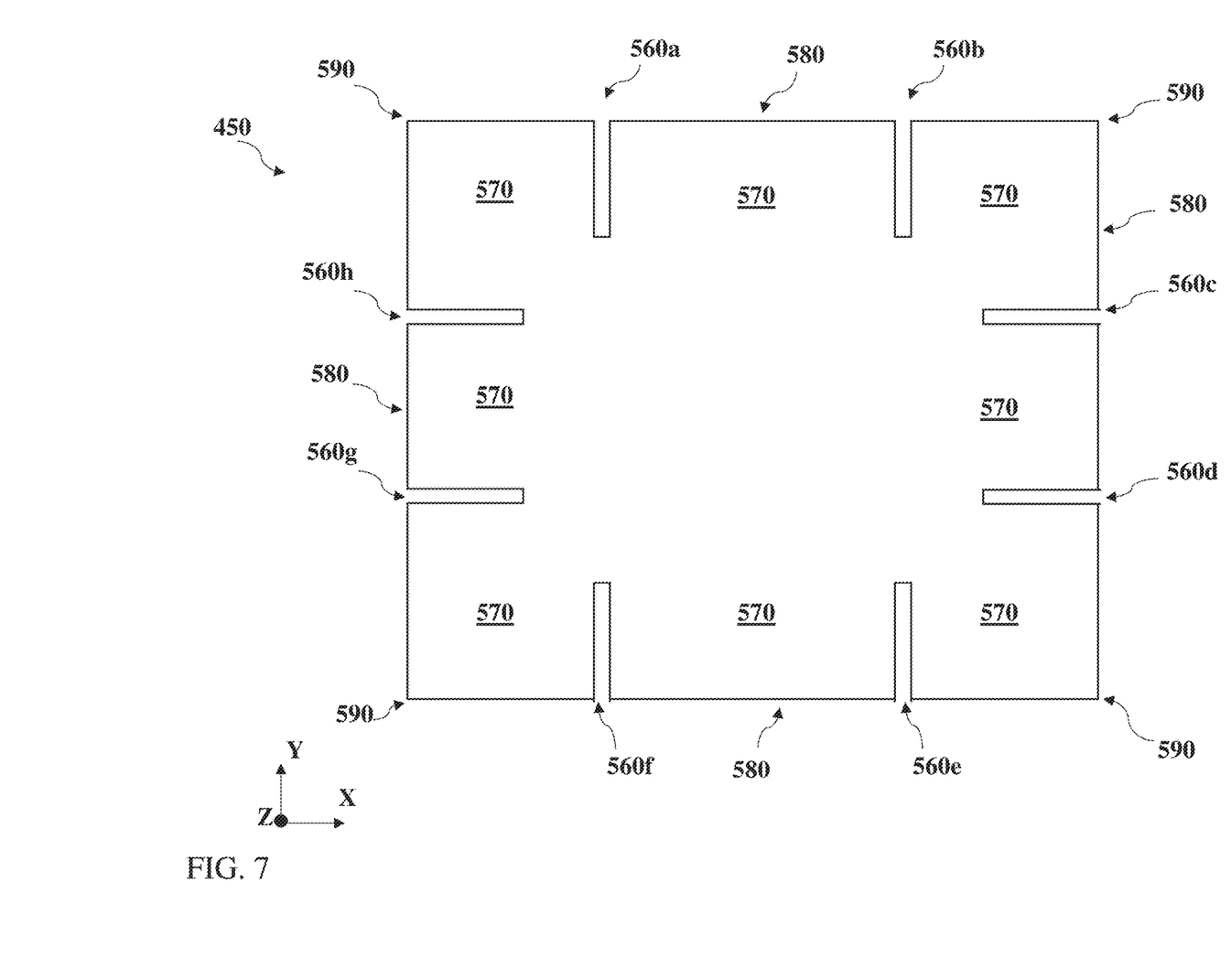
FIG. 7 is a plan view of a flexible PCB according to various implementations.

As shown in FIGS. 5 and 6, the flexible PCB 450 includes at least one slit 560 that enables the flexible PCB 450 to conform with the compound curve of the inner surface 510. FIG. 7 shows a plan view of the flexible PCB 450, which further illustrates sections 570 at least partially separated by the slit(s) 560 (with separate slits denoted by: a, b, c, d, etc.). In some cases, slits 560 extend from one or more edge(s) 580 of the PCB 450, e.g., as an opening on one of the edges 580. In the example depicted in FIG. 7, the flexible PCB 450 has two slits 560 on each edge 580 that partially separate three sections 570. However, it is understood that any number of slits 560 greater than one can be used to separate corresponding sections 570 in the PCB 450. In some cases, slits 560 are evenly spaced across one or more of the edges 580, such that any two slits 560 in a group of three or more slits 560 are separated by an equal space as measured along an edge 580. In some cases, slits 560 are equally spaced from corners 590 between edges 580. In further implementations, slits 560 are equally spaced from corners 590 and from one another, such that a spacing between adjacent slits 560 is equal to a spacing between a slit 560 and a nearest corner 590. In still other cases, the slits 560 are closer together than each slit 560 is spaced from a corner 590, such that spacing between the slits 560 is not equal to a spacing with a nearest corner 590.

In some cases, each slit 560 has a length-to-width ratio (length measured from edge 580 inward, and width measured parallel to inner surface 510) of at least 1:1. In certain additional implementations, each slit 560 has a length-to-width ratio of at least 2:1 or at least 3:1. In certain implementations, the length-to-width ratio of each slit 560 is proportional to the thickness of the PCB 450, such that a thicker PCB 450 allows for a greater length-to-width ratio for each slit 560.

In various implementations, slits 560 extend only partially through the flexible PCB 450 in the X and Y direction. That is, each slit 560 extends along only part of the length or width of the flexible PCB 450. In certain cases, for example as illustrated in FIG. 7, each slit 560 extends entirely through the PCB 450 in the Z direction (or, depth direction, indicated as into and out of the page). However, in other implementations, each slit 560 extends only partially through the PCB 450 in the Z direction. Once coupled with the inner surface 510 of the wall 500, the PCB 450 is configured to flex at the slit(s) 560 in order to conform with that inner surface 510. In particular cases, the slit(s) 560 enable the PCB 450 to conform with the compound curve of the inner surface 510 without interference between adjacent sections 570. That is, in contrast to conventional configurations, the PCB 450 is configured to flex and conform to the compound curve of the inner surface 510 without causing mechanical stress on that PCB 450 and its circuitry. Additionally, because the slits 560 mitigate tension in the PCB 450, that PCB 450 is more effectively coupled (e.g., adhered) to the inner surface 510 when compared with conventional approaches.

Figure 8:
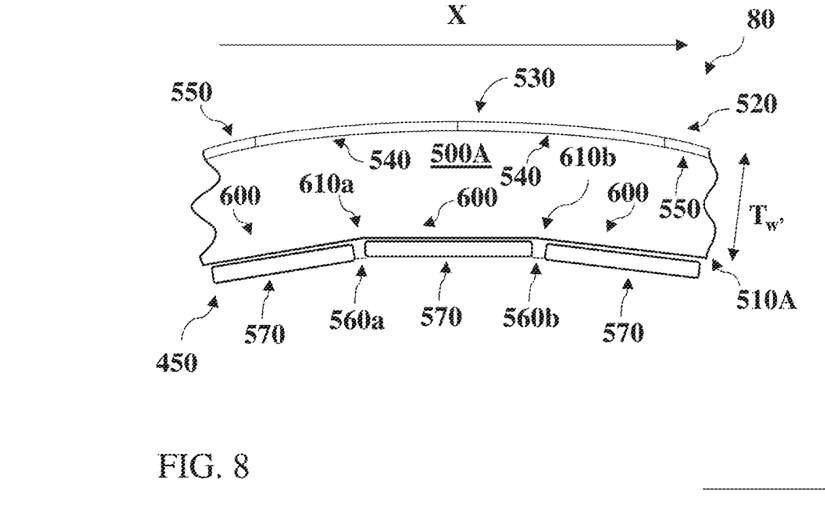
FIG. 8 is a first cross-sectional view of an audio device wall and flexible printed circuit board (PCB) according to various additional implementations.
Figure 9:
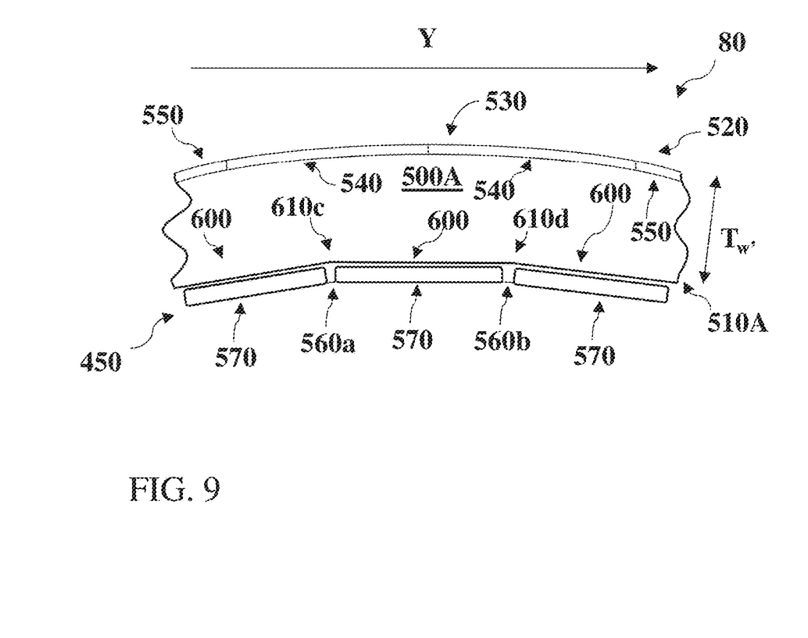
FIG. 9 is a second cross-sectional view of the audio device wall and flexible PCB in FIG. 8.

In additional implementations, for example as shown in FIGS. 8 and 9, a wall 500A of an audio device 10 is shown with an inner surface 510A that includes facets 600 connected by a set of junctions 610. In certain implementations, at least one junction 610 separates at least two facets 600. In particular examples, the wall 500A includes at least three facets 600 that are separated by at least two junctions 610. In these cases, the facets 600 are planar or approximately (e.g., within a margin of measurement error such as by several percent or less) planar, and are positioned at angles relative to one another due to the junctions 610. In some example implementations, each of the facets 600 has an approximately equal surface area. However, in other implementations, one or more facets 600 has a distinct surface area from a remainder of the facets 600.

According to various implementations, the junctions 610 permit the inner surface 510A to approximate a contour, e.g., in order to approximately track the compound curved shape of the outer surface 520. The junctions 610 can include slots or tracks that extend entirely through the wall 500A in the lengthwise or widthwise directions. In other cases, the junctions 610 are simply the interface between adjacent facets 600, with minimal or negligible width or depth relative the surface of the facets 600. In certain cases, as illustrated in the plan view of wall 500A in FIG. 10, the inner surface 510A can include a grid or matrix of junctions 610 that enable the wall 500A to approximate a compound curve (e.g., to approximate a curve in two different directions). In additional implementations, each facet 600 has a non-uniform thickness across its length, such that a portion of each facet 600 is thinner proximate a junction 610 with an adjacent facet than a remaining portion of the facet 600. That is, in addition to junctions 610, the wall 500A can include tapered facets 600 that thin as they approach junctions 610, which can further enable the wall 500A to approximate a compound curve.

Figure 10:
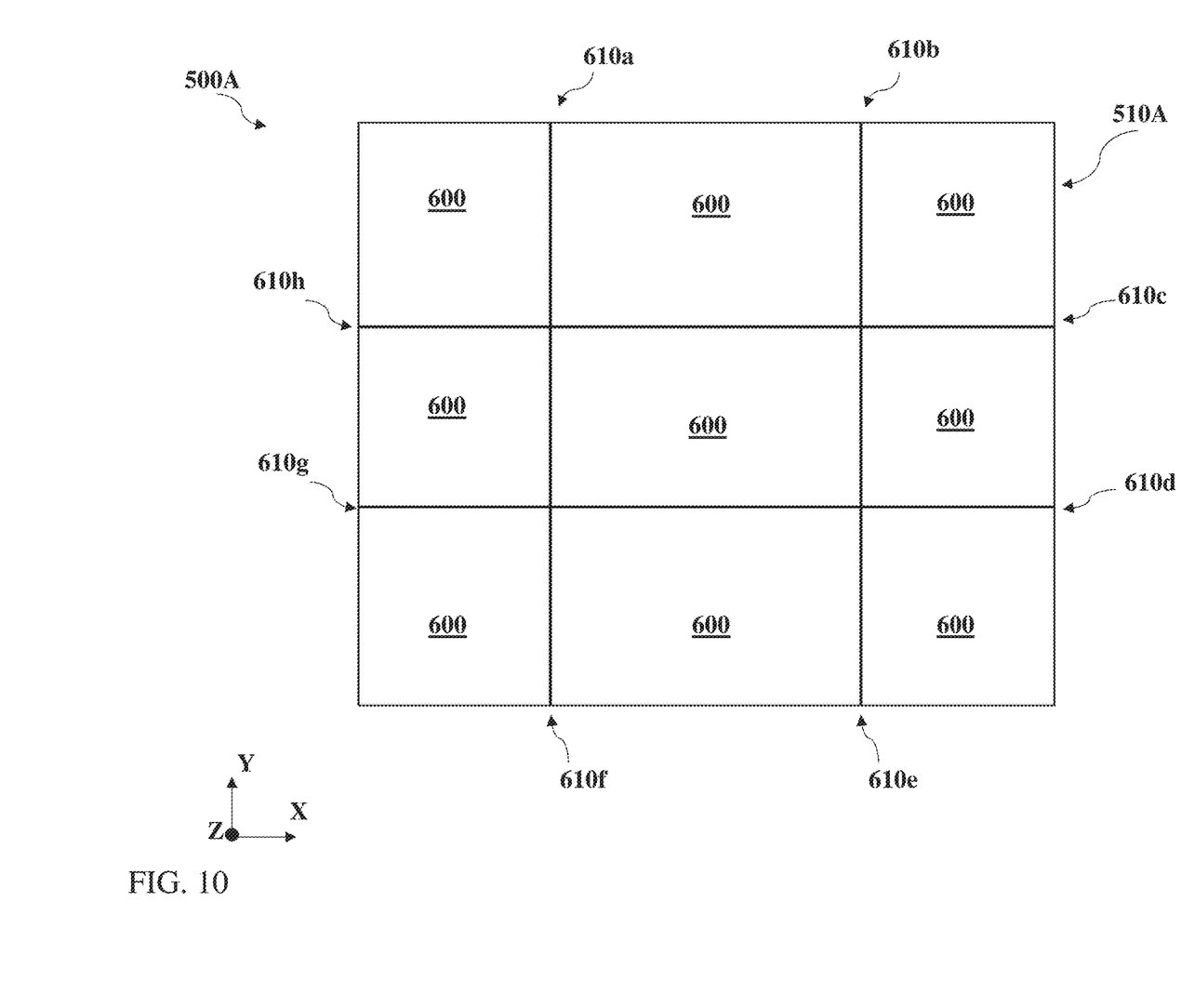
FIG. 10 is a plan view of a faceted audio device wall according to various implementations.

In certain implementations, as shown in FIGS. 9 and 10, the flexible PCB 450 is coupled with (e.g., adhered to) the inner surface 510A, e.g., at the facets 600. According to particular implementations, the flexible PCB 450 including slits 560 is configured to mate with the inner surface 510A, e.g., where sections 570 of the PCB 450 correspond with facets 600 of the inner surface 510A. In these cases, one or more of the junctions 610 can align with slits 560 in the PCB 450, further enhancing the bond between the PCB 450 and the inner surface 510A of the wall 500A.

In any case, the wall 500A enables improved coupling with either PCB 450 or PCB(s) 650, such that mechanical stresses from that coupling are mitigated when compared with conventional configurations. The faceted wall 500A also enables coupling with distinct PCBs and/or other circuitry while mitigating mechanical stresses on bonding between those circuit components and the interface 80.

Figure 11:
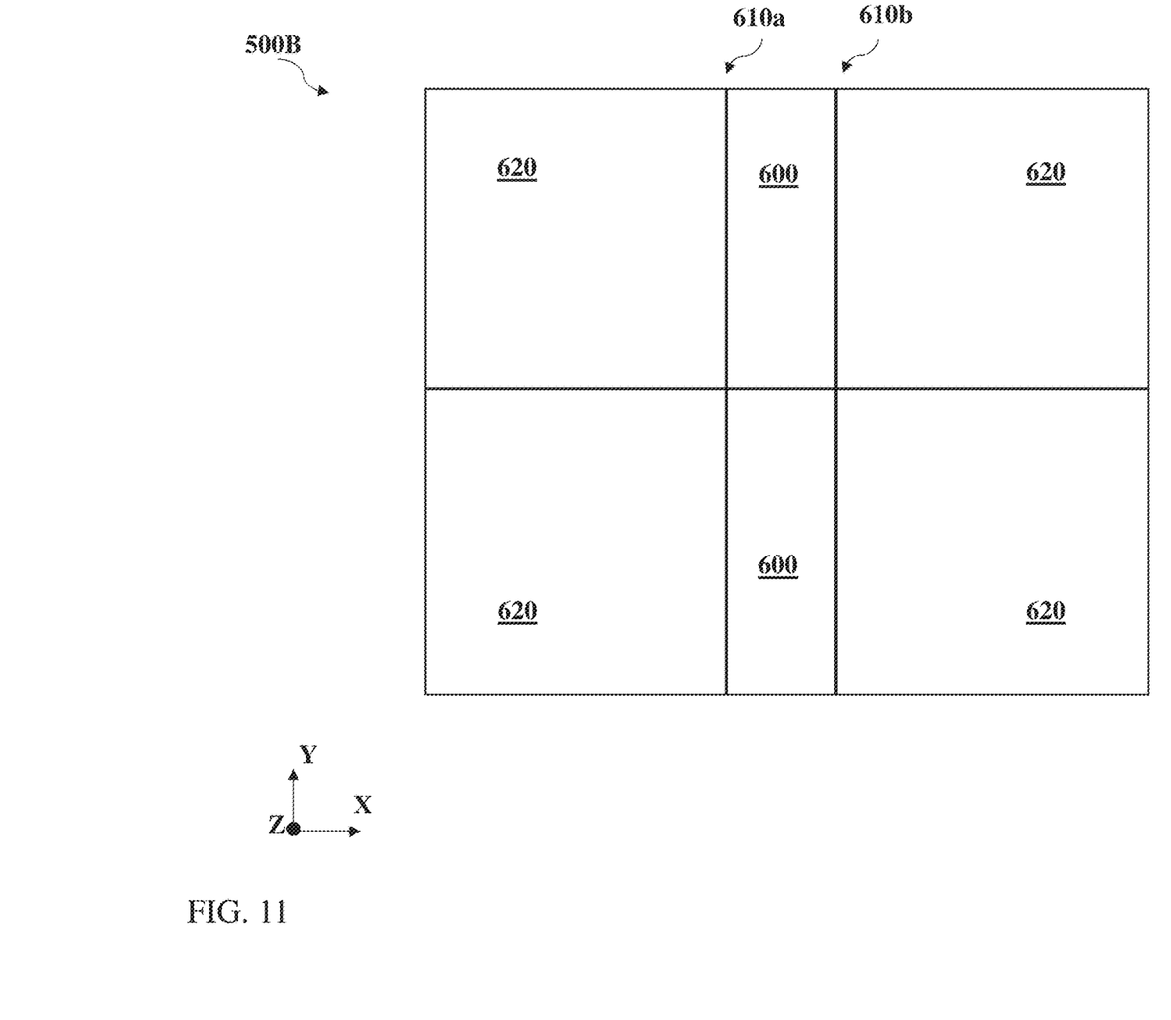
FIG. 11 is a plan view of an audio device wall including facets and simple curved surfaces according to various implementations.

FIG. 11 shows an additional implementation of a wall 500B, viewed from the inner surface 510B, according to various additional implementations. In these cases, the inner surface 510B has at least one section with a simple curved shape, i.e., section(s) that only curve in one of the X or Y directions. In the example depiction in FIG. 11, the inner surface 510B includes a set of facets 600, and adjacent to the facets 600, are simple curved sections 620. Simple curved sections 620 are understood to curve outward (concave) along the X axis in this example. However, in other implementations, facets 600 can extend lengthwise in the X direction and adjacent curved sections 620 can curve (e.g., outward) along the Y axis. In these cases, junctions 610 can be aligned with slits 560 in a PCB (e.g., in PCB 450, FIG. 7). In other cases, junctions 610 are misaligned with one or more slits 560 in a PCB (e.g., PCB 450, FIG. 7) that is mounted to the inner surface 510B.

The functionality described herein, or portions thereof, and its various modifications (hereinafter "the functions") can be implemented, at least in part, via a computer program product, e.g., a computer program tangibly embodied in an information carrier, such as one or more non-transitory machine-readable media, for execution by, or to control the operation of, one or more data processing apparatus, e.g., a programmable processor, a computer, multiple computers, and/or programmable logic components.

A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a network.

Actions associated with implementing all or part of the functions can be performed by one or more programmable processors executing one or more computer programs to perform the functions of the calibration process. All or part of the functions can be implemented as, special purpose logic circuitry, e.g., an FPGA and/or an ASIC (application-specific integrated circuit). Processors suitable for the execution of a computer program include, by way of example, both general and special purpose microprocessors, and any one or more processors of any kind of digital computer. Generally, a processor will receive instructions and data from a read-only memory or a random access memory or both. Components of a computer include a processor for executing instructions and one or more memory devices for storing instructions and data.

Elements of figures are shown and described as discrete elements in a block diagram. These may be implemented as one or more of analog circuitry or digital circuitry. Alternatively, or additionally, they may be implemented with one or more microprocessors executing software instructions. The software instructions can include digital signal processing instructions. Operations may be performed by analog circuitry or by a microprocessor executing software that performs the equivalent of the analog operation. Signal lines may be implemented as discrete analog or digital signal lines, as a discrete digital signal line with appropriate signal processing that is able to process separate signals, and/or as elements of a wireless communication system.

When processes are represented or implied in the block diagram, the steps may be performed by one element or a plurality of elements. The steps may be performed together or at different times. The elements that perform the activities may be physically the same or proximate one another, or may be physically separate. One element may perform the actions of more than one block. Audio signals may be encoded or not, and may be transmitted in either digital or analog form. Conventional audio signal processing equipment and operations are in some cases omitted from the drawings.

In various implementations, components described as being "coupled" to one another can be joined along one or more interfaces. In some implementations, these interfaces can include junctions between distinct components, and in other cases, these interfaces can include a solidly and/or integrally formed interconnection. That is, in some cases, components that are "coupled" to one another can be simultaneously formed to define a single continuous member. However, in other implementations, these coupled components can be formed as separate members and be subsequently joined through known processes (e.g., soldering, fastening, ultrasonic welding, bonding). In various implementations, electronic components described as being "coupled" can be linked via conventional hard-wired and/or wireless means such that these electronic components can communicate data with one another. Additionally, sub-components within a given component can be considered to be linked via conventional pathways, which may not necessarily be illustrated.

Other embodiments not specifically described herein are also within the scope of the following claims. Elements of different implementations described herein may be combined to form other embodiments not specifically set forth above. Elements may be left out of the structures described herein without adversely affecting their operation. Furthermore, various separate elements may be combined into one or more individual elements to perform the functions described herein.

We claim:
1. An audio device comprising:
a housing comprising a set of walls, wherein at least one of the walls has a compound curved shape comprising an outer surface and an inner surface each with a compound curve; and
a capacitive sensing interface integrated with the wall having the compound curved shape, the capacitive sensing interface comprising:

a contact surface for receiving a touch command at the outer surface of the wall; and a flexible printed circuit board (PCB) underlying the contact surface for detecting the touch command at the contact surface, wherein the flexible PCB extends along the inner surface of the wall and comprises at least one slit that enable the flexible PCB to conform with the compound curve of the inner surface.

2. The audio device of claim 1, wherein each of the at least one slit partially separates sections of the flexible PCB.

3. The audio device of claim 2, wherein the at least one slit comprises at least two slits that partially separate at least three sections of the flexible PCB.

4. The audio device of claim 2, wherein the at least one slit enables the flexible PCB to conform with the compound curve of the inner surface without interference between adjacent sections of the flexible PCB.

5. The audio device of claim 1, wherein each slit has a length-to-width ratio of at least 1:1.

6. The audio device of claim 1, further comprising:

an acoustic transducer comprising a sound-radiating surface for providing an audio output; and a controller coupled with the acoustic transducer and the flexible PCB, the controller configured to control the audio output from the acoustic transducer based on commands received at the capacitive sensing interface.

7. The audio device of claim 1, wherein the capacitive sensing interface comprises a capacitive touch interface for detecting the touch command from a human user.

8. The audio device of claim 1, wherein the compound curve of the inner surface comprises a convex compound curve or a concave compound curve.

9. The audio device of claim 1, wherein the audio device comprises a wearable audio device comprising at least one of: headphones, earphones, audio eyeglasses, body-worn speakers, or audio jewelry.

10. The audio device of claim 1, wherein the wall has a substantially constant thickness along a longest dimension of the capacitive sensing interface.

11. The audio device of claim 1, further comprising an adhesive coupling the flexible PCB with the inner surface of the wall.

12. An audio device comprising:

a housing comprising a set of walls, wherein at least one of the walls has a compound curved shape comprising an outer surface and an inner surface, wherein the inner surface comprises distinct facets connected by a set of junctions; and a capacitive sensing interface integrated with the wall having the compound curved shape, the capacitive sensing interface comprising:

a contact surface for receiving a touch command at the outer surface of the wall; and a flexible printed circuit board (PCB) underlying the contact surface for detecting the touch command at the contact surface, wherein the flexible PCB extends along the inner surface of the wall.

13. The audio device of claim 12, wherein the set of junctions comprises at least two junctions that connect at least three facets of the inner surface.

14. The audio device of claim 12, wherein each facet has a non-uniform thickness across its length such that a portion of each facet is thinner proximate a junction with an adjacent facet than a remaining portion of the facet.

15. The audio device of claim 12, wherein the set of junctions enable the flexible PCB to conform with the inner surface without interference between adjacent sections of the flexible PCB.

16. The audio device of claim 12, further comprising an adhesive coupling the flexible PCB with the inner surface of the wall, wherein each of the facets has an approximately equal surface area.

17. The audio device of claim 12, further comprising:

an acoustic transducer comprising a sound-radiating surface for providing an audio output; and a controller coupled with the acoustic transducer and the flexible PCB, the controller configured to control the audio output from the acoustic transducer based on commands received at the capacitive sensing interface, wherein the capacitive sensing interface comprises a capacitive touch interface for detecting the touch command from a human user.

18. The audio device of claim 12, wherein the compound curve of the outer surface comprises a concave compound curve, and wherein the inner surface further comprises at least one curved section adjacent to at least one of the facets.

19. The audio device of claim 12, wherein the audio device comprises a wearable audio device comprising at least one of: headphones, earphones, audio eyeglasses, body-worn speakers, or audio jewelry.

20. The audio device of claim 12, wherein the flexible PCB comprises at least one slit that enable the flexible PCB to conform with the inner surface.

* * * * *